(12) United States Patent
Do et al.

(10) Patent No.: US 10,658,027 B2
(45) Date of Patent: May 19, 2020

(54) HIGH DENSITY SPLIT-GATE MEMORY CELL

(71) Applicant: Silicon Storage Technology, Inc., San Jose, CA (US)

(72) Inventors: Nhan Do, Saratoga, CA (US); Xian Liu, Sunnyvale, CA (US); Vipin Tiwari, Dublin, CA (US); Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/002,302

(22) Filed: Jan. 20, 2016

(65) Prior Publication Data

US 2016/0217849 A1    Jul. 28, 2016

Related U.S. Application Data

(60) Provisional application No. 62/106,477, filed on Jan. 22, 2015.

(51) Int. Cl.
*H01L 29/76* (2006.01)
*G11C 11/419* (2006.01)
(Continued)

(52) U.S. Cl.
CPC ........ *G11C 11/419* (2013.01); *G11C 16/0458* (2013.01); *G11C 16/14* (2013.01);
(Continued)

(58) Field of Classification Search
CPC ..................................................... H01L 21/28
See application file for complete search history.

(56) References Cited

U.S. PATENT DOCUMENTS 6,646,914 B1    11/2003  Haddad
6,747,310 B2    6/2004   Fan et al.
(Continued)

FOREIGN PATENT DOCUMENTS

JP    H07-508859 A    9/1995
JP    H08-83855 A     3/1996
(Continued)

*Primary Examiner* — Kenneth Parker
*Assistant Examiner* — Christopher A Culbert
(74) *Attorney, Agent, or Firm* — DLA Piper LLP (US)

(57) ABSTRACT

A method of forming a memory device that includes forming on a substrate, a first insulation layer, a first conductive layer, a second insulation layer, a second conductive layer, a third insulation layer. First trenches are formed through third insulation layer, the second conductive layer, the second insulation layer and the first conductive layer, leaving side portions of the first conductive layer exposed. A fourth insulation layer is formed at the bottom of the first trenches that extends along the exposed portions of the first conductive layer. The first trenches are filled with conductive material. Second trenches are formed through the third insulation layer, the second conductive layer, the second insulation layer and the first conductive layer. Drain regions are formed in the substrate under the second trenches. A pair of memory cells results, with a single continuous channel region extending between drain regions for the pair of memory cells.

7 Claims, 8 Drawing Sheets

(51) Int. Cl.
  *G11C 16/04* (2006.01)
  *G11C 16/14* (2006.01)
  *H01L 21/28* (2006.01)
  *H01L 29/423* (2006.01)
  *H01L 29/66* (2006.01)
  *H01L 29/788* (2006.01)
  *H01L 27/11521* (2017.01)

(52) U.S. Cl.
  CPC .. *H01L 27/11521* (2013.01); *H01L 29/40114* (2019.08); *H01L 29/42328* (2013.01); *H01L 29/66825* (2013.01); *H01L 29/7887* (2013.01)

(56) References Cited

U.S. PATENT DOCUMENTS

| | | | |
|---|---|---|---|
| 7,868,375 B2 | 1/2011 | Liu et al. | |
| 2002/0109138 A1* | 8/2002 | Forbes | H01L 29/7881 |
| | | | 257/51 |
| 2003/0146465 A1* | 8/2003 | Wu | G11C 16/0458 |
| | | | 257/314 |
| 2005/0024961 A1 | 2/2005 | Ding | |
| 2008/0049517 A1 | 2/2008 | Hung et al. | |
| 2008/0123416 A1 | 5/2008 | Chih | |
| 2009/0108328 A1 | 4/2009 | Widjaja | |
| 2010/0008141 A1 | 1/2010 | Chu | |
| 2012/0206969 A1* | 8/2012 | Gu | H01L 21/28273 |
| | | | 365/185.18 |
| 2014/0151782 A1 | 6/2014 | Tsair et al. | |
| 2016/0133639 A1 | 5/2016 | Tran et al. | |

FOREIGN PATENT DOCUMENTS

| | | |
|---|---|---|
| JP | 2012 222201 | 11/2012 |
| JP | 2014 096421 | 5/2014 |
| KR | 10-2009-0106573 A | 10/2009 |
| KR | 10-2014-0057582 A | 5/2014 |
| TW | 200802816 | 1/2008 |
| WO | 2014 051855 | 4/2014 |

* cited by examiner

| | WL | | BL | | SL | | CG | | EG | |
|---|---|---|---|---|---|---|---|---|---|---|
| | Sel. | Unsel. | Sel. | Unsel. | Sel. | Unsel. | Sel. | Unsel. | Sel. | Unsel. |
| Erase | 0V | 0V | 0V | 0V | 0V | 0V | 0V | 0V | 11.5V | 0V |
| Read | 2.5V | 0V | 0.8V | 0V | 0V | 0V | 2.5V | 2.5V | 0V | 0V |
| Program | 1V | 0V | 1μA | 2.5V | 4.5V | 0.5V | 10.5V | 0/2.5V | 4.5V | 0.5V |

|  | Erase Gate 20 | Coupling Gate 18A | Coupling Gate 18B | Bit Line 12A | Bit Line 12B |
| --- | --- | --- | --- | --- | --- |
| Erase Cells 10A/10B | 8V | -8V | -8V | 0V | 0V |
| Program Cell 10A | 1~2V | 8~10V | 2~3V | ~5V | ~1-2µA |
| Program Cell 10B | 1~2V | 2~3V | 8~10V | ~1-2µA | ~5V |
| Read Cell 10A | 1~3V | 0V | 3~5V | 0 | ~1V |
| Read Cell 10B | 1~3V | 3~5V | 0V | ~1V | 0V |

FIG. 4

«HIGH DENSITY SPLIT-GATE MEMORY CELL»

RELATED APPLICATIONS

This application claims the benefit of U.S. Provisional Application No. 62/106,477, filed Jan. 22, 2015.

FIELD OF THE INVENTION

The present invention relates to non-volatile memory cell arrays.

BACKGROUND OF THE INVENTION

It is well known in the art to form split-gate memory cells as an array of such cells, where the memory cells are formed in pairs, where each pair of memory cells shares a common erase gate and a common source region. For example, U.S. Pat. No. 7,868,375 (which is incorporated herein by reference for all purposes) discloses such a memory array.

FIG. 1 illustrates a conventional pair of split-gate memory cells 1. Each memory cell 1 includes a source region (source line) 2 and a drain region (bit line) 3, with a channel region 4 defined in the substrate there between. A floating gate 5 is disposed over and insulated from a first portion of the channel region 4, and a word line gate 6 is disposed over and insulated from a second portion of the channel region 4. A coupling gate 7 is formed over and insulated from the floating gate 5. An erase gate 8 is formed over and insulated from the source region 2.

The floating gate 5 for each cell is programmed by injecting electrons from a stream of electrons travelling along the channel region 4 up onto the floating gate 5 (via hot electron injection). This is illustrated in FIG. 1 by the electron arrow traveling along the channel region 4, and then up through the insulation material to the floating gate 5. The floating gate 5 is erased by inducing tunneling of electrons from the floating gate 5 to the erase gate 8 (through Fowler Nordheim tunneling). This is illustrated in FIG. 1 by the electron arrow traveling from the floating gate 5, through the insulation, to the erase gate 8. One non-limiting example of the erase, read and program voltages is illustrated in FIG. 2, where the selected (Sel.) lines are those containing the memory cell being operated on and the unselected (Unsel.) lines are those not containing the memory cell being operated on. Each memory cell is individually read by placing a positive voltage on that cell's word line gate to turn on the channel region portion below, and measuring the conductivity of its channel region (which is affected by whether or not the cell's floating gate is programmed with electrons which dictates whether the underlying channel region portion is conductive). Each memory cell is individually programmed by streaming electrons along its channel region and coupling a high positive voltage to its floating gate.

Given the number of gates in this cell design, it is challenging to scale down the memory cells in size.

BRIEF SUMMARY OF THE INVENTION

The aforementioned issues are addressed by a method of forming a memory device that includes forming a plurality of separated first trenches into a surface of a semiconductor substrate (wherein the first trenches are parallel to each other and extend in a first direction and define active regions of the substrate between the first trenches), filling the first trenches with insulation material, forming a first insulation layer on the surface of the substrate in each of the active regions, forming a first conductive layer on the first insulation layer in each of the active regions, forming a second insulation layer on the first conductive layer in each of the active regions, forming a second conductive layer on the second insulation layer in each of the active regions, forming a third insulation layer on the second conductive layer in each of the active regions, forming a plurality of separated second trenches through the third insulation layer (wherein the second trenches are parallel to each other and extend in a second direction perpendicular to the first direction), extending the second trenches through the second conductive layer and the second insulation layer, extending the second trenches through the first conductive layer, leaving side portions of the first conductive layer exposed, forming a fourth insulation layer at the bottom of the second trenches that extends along the exposed portions of the first conductive layer, filling the second trenches with conductive material, wherein the conductive material is insulated from the substrate surface and the first conductive layer by the fourth insulation layer, forming a plurality of third trenches through the third insulation layer, wherein the third trenches are parallel to each other and extend in the second direction such that the second and third trenches alternate each other, extending the third trenches through the second conductive layer, the second insulation layer, and the first conductive layer, performing an implantation to form drain regions in the substrate under the third trenches.

A memory device includes a substrate of semiconductor material of a first conductivity type, spaced apart isolation regions formed on the substrate which are substantially parallel to one another and extend in a first direction, with an active region between each pair of adjacent isolation regions also extending in the first direction. Each of the active regions includes a plurality of pairs of memory cells, each of the memory cell pairs including first and second regions spaced apart in the substrate and having a second conductivity type different than the first conductivity type, with a continuous channel region in the substrate extending between the first and second regions, a first floating gate disposed over and insulated from a first portion of the channel region adjacent to the first region, a second floating gate disposed over and insulated from a second portion of the channel region adjacent to the second region, an erase gate disposed over and insulated from a third portion of the channel region between the first and second channel region portions, a first coupling gate disposed over and insulated from the first floating gate, and a second coupling gate disposed over and insulated from the second floating gate. Control circuitry is configured to read one of the pairs of memory cells by applying to the one pair of memory cells a zero voltage to the first region, a positive voltage to the second region, a zero or positive voltage to the first coupling gate, a positive voltage to the second coupling gate, and a positive voltage to the erase gate; and by detecting an electrical current through the channel region.

A memory device includes a substrate of semiconductor material of a first conductivity type, spaced apart isolation regions formed on the substrate which are substantially parallel to one another and extend in a first direction, with an active region between each pair of adjacent isolation regions also extending in the first direction. Each of the active regions includes a plurality of pairs of memory cells, each of the memory cell pairs including first and second regions spaced apart in the substrate and having a second conductivity type different than the first conductivity type, with a continuous channel region in the substrate extending between the first and second regions, a first floating gate disposed over and insulated from a first portion of the channel region adjacent to the first region, a second floating gate disposed over and insulated from a second portion of the channel region adjacent to the second region, an erase gate disposed over and insulated from a third portion of the channel region between the first and second channel region portions, a first coupling gate disposed over and insulated from the first floating gate, and a second coupling gate disposed over and insulated from the second floating gate. Control circuitry is configured to program one of the pairs of memory cells by applying to the one pair of memory cells a first positive voltage to the first region, a current to the second region, a second positive voltage to the first coupling gate, a third positive voltage to the second coupling gate, and a fourth positive voltage to the erase gate.

A memory device includes a substrate of semiconductor material of a first conductivity type, spaced apart isolation regions formed on the substrate which are substantially parallel to one another and extend in a first direction, with an active region between each pair of adjacent isolation regions also extending in the first direction. Each of the active regions includes a plurality of pairs of memory cells, each of the memory cell pairs including first and second regions spaced apart in the substrate and having a second conductivity type different than the first conductivity type, with a continuous channel region in the substrate extending between the first and second regions, a first floating gate disposed over and insulated from a first portion of the channel region adjacent to the first region, a second floating gate disposed over and insulated from a second portion of the channel region adjacent to the second region, an erase gate disposed over and insulated from a third portion of the channel region between the first and second channel region portions, a first coupling gate disposed over and insulated from the first floating gate, and a second coupling gate disposed over and insulated from the second floating gate. Control circuitry is configured to erase one of the pairs of memory cells by applying to the one pair of memory cells a zero voltage to the first region, a zero voltage to the second region, a first negative voltage to the first coupling gate, a second negative voltage to the second coupling gate, and a positive voltage to the erase gate.

A memory device includes a substrate of semiconductor material of a first conductivity type, spaced apart isolation regions formed on the substrate which are substantially parallel to one another and extend in a first direction, with an active region between each pair of adjacent isolation regions also extending in the first direction. Each of the active regions includes a plurality of pairs of memory cells, each of the memory cell pairs including first and second regions spaced apart in the substrate and having a second conductivity type different than the first conductivity type, with a continuous channel region in the substrate extending between the first and second regions, a first floating gate disposed over and insulated from a first portion of the channel region adjacent to the first region, a second floating gate disposed over and insulated from a second portion of the channel region adjacent to the second region, an erase gate disposed over and insulated from a third portion of the channel region between the first and second channel region portions, a first coupling gate disposed over and insulated from the first floating gate, and a second coupling gate disposed over and insulated from the second floating gate. Control circuitry is configured to erase one memory cell of a pair of memory cells by applying to the one pair of memory cells a zero voltage to the first region, a zero voltage to the second region, a first negative voltage to the first coupling gate, a zero or positive voltage to the second coupling gate, and a positive voltage to the erase gate.

Other objects and features of the present invention will become apparent by a review of the specification, claims and appended figures.

BRIEF DESCRIPTION OF THE DRAWINGS

FIG. 4 is a table showing erase, program and read voltages for the pair of memory cells according to the present invention.

DETAILED DESCRIPTION OF THE INVENTION

Figures 1, 2:
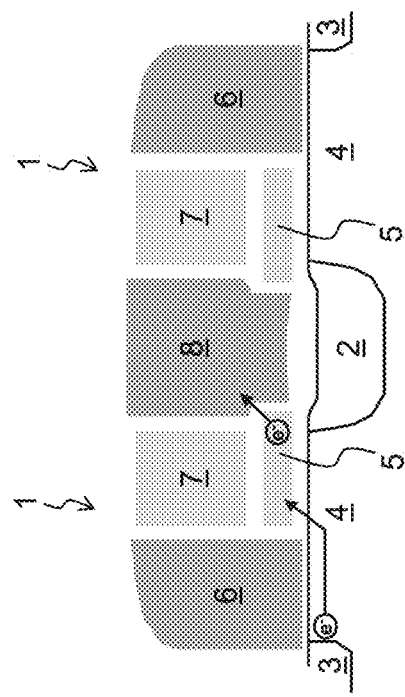
FIG. 1 is a side cross sectional view showing conventional memory cells.
FIG. 2 is a table showing erase, read and program voltages for the conventional memory cells.
Figure 3:
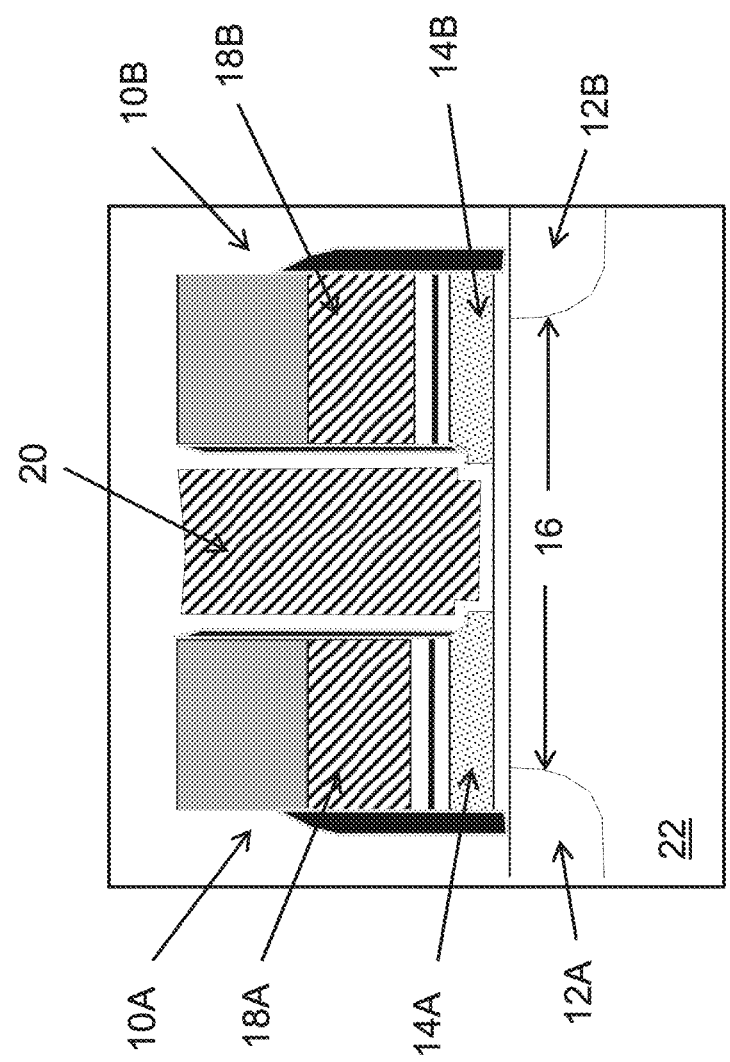
FIG. 3 is a side cross sectional view showing a pair of memory cells according to the present invention.

The present invention is a memory cell configuration which can be scaled to smaller sizes by the elimination of the source region and the word line gate. A pair of memory cells according the present invention is illustrated in FIG. 3.

Each memory cell 10A and 10B respectively includes a drain region (bit line BL) 12A and 12B, a floating gate FG 14A and 14B over a portion of the channel region 16, a coupling gate CG 18A and 18B over the floating gate 14A or 14B, and an erase gate EG 20 over another portion of the channel region 16 (the erase gate 20 is shared by the pair of memory cells). The two memory cells 10A and 10B share a single continuous channel region 16 that extends between the two drain regions 12A and 12B, the conductivity of which is controlled by both floating gates 14A and 14B of both memory cells 10A and 10B, and the common erase gate 20. The drain regions 12A/12B and channel region 16 are formed in a semiconductor substrate 22 (e.g. P type substrate or P type well in an N type substrate).

A non-limiting example of the erase, read and program voltages are illustrated in FIG. 4. Erasing the pair of memory cells is performed by placing a relatively high positive voltage (e.g. 8V) on the erase gate 20, and a relatively high negative voltage (e.g. −8V) on both coupling gates 18A and 18B. Electrons on the floating gates 14A/14B will tunnel through the intervening insulation material from the floating gates to the erase gate. Alternatively erasing a memory cell of a pair of memory cells is performed by placing a relatively high positive voltage (e.g. 8V) on the erase gate 20, and a relatively high negative voltage (e.g. −8V) on coupling gate 18A and a zero or positive voltage (e.g., 0-5V) on coupling gate 18B.

Cell 10A is programmed by placing a relatively high positive voltage (e.g. 8-10V) on its coupling gate 18A, a relatively low positive voltage (e.g. 2-3V) on the other cell's coupling gate 18B, and a relatively low positive voltage on the erase gate 20 (e.g. 1-2V). When a positive voltage (e.g. 5V) is applied to the cell's bit line 12A and an electron source is applied on the other cell's bit line 12B (e.g. 1-2 µA), electrons from bit line 12B will travel along the channel region under coupling gate 18B and erase gate 20, because the underlying channel region portions are turned on (i.e. rendered conductive) by the positive voltages on coupling gate 18B (capacitively coupled to floating gate 14B) and erase gate 20. As the electrons approach floating gate 14A, they will see the high voltage coupled to floating gate 14A by coupling gate 18A and a fraction of electrons then getting injected through the insulation under floating gate 14A via hot electron injection and onto floating gate 14A. Cell 10B is programmed by swapping the relevant voltages for bit lines 12A/12B and coupling gates 18A/18B.

Cell 10A is read by placing a relatively low voltage (e.g. 1-3V) on the erase gate 20 to turn on the portion of the channel region 16 under erase gate 20. A high enough voltage is applied to coupling gate 18B (e.g. 3-5V) such that it is coupled to floating gate 14B to turn on the portion of the channel region under floating gate 14B. A relatively low positive voltage is applied to bit line 12B (e.g. 1V), and relatively low positive voltage applied to coupling gate 18A (e.g., 0-3V) and no or ground voltage applied to bitline 12A. If floating gate 14A is programmed with electrons, the underlying portion of the channel region will have low or no conduction, and this is sensed as a programmed state (e.g. a "1" state). If floating gate 14A is not programmed with electrons (i.e. erased), then the underlying portion of the channel region (together with the other portions of the channel region) will have a relatively high conduction, and this is sensed as an erased state (e.g. a "0" state). Cell 10B is read by swapping the relevant voltages for bit lines 12A/12B and coupling gates 18A/18B.

The memory cell configuration of FIG. 3 allows for a smaller cell size because there is no source region and no word line gate (i.e. spacing between floating gates in the bit line direction can be scaled down further due to the absence of any source diffusion). The memory cell pair 10A/10B is easier to make with fewer masking steps.

Figure 5A:
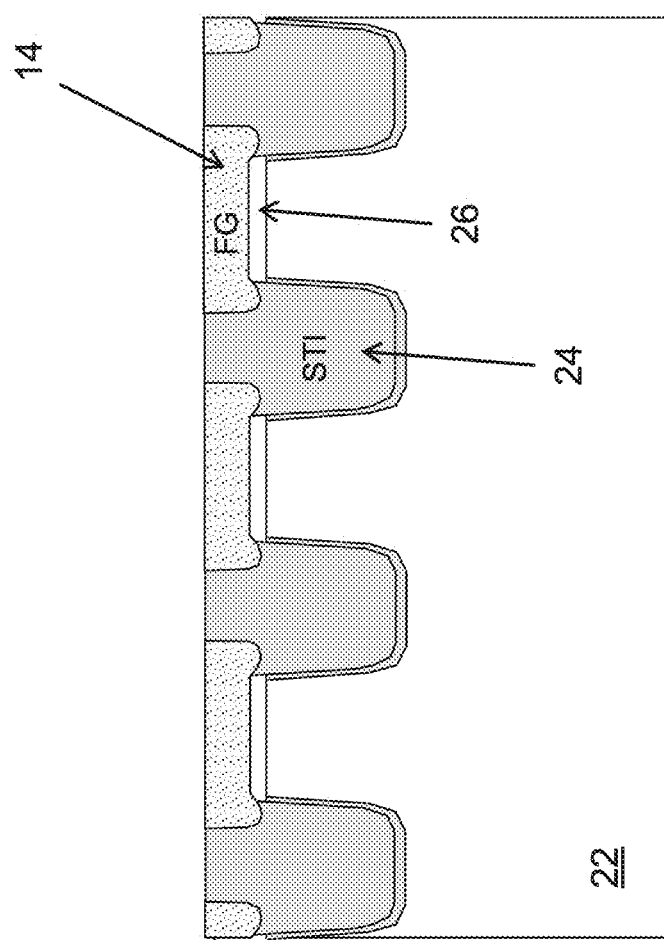
FIGS. 5A-5E are side cross sectional views showing the sequence of steps in forming the memory cells of the present invention.

The formation of memory cell pair 10A/10B is now described with reference to FIGS. 5A-5E. Starting with the silicon semiconductor substrate 22, STI isolation regions are formed by forming trenches into the substrate and filling them with insulation material 24 (e.g. STI insulation) such as oxide. A floating gate oxide layer 26 is formed over the substrate 22, followed by polysilicon deposition and CMP etch back to form a poly layer 14 (FG poly layer) that eventually will constitute the floating gates 14A/14B. The resulting structure is shown in FIG. 5A (a cross section view in the coupling gate direction).

Figure 5B:
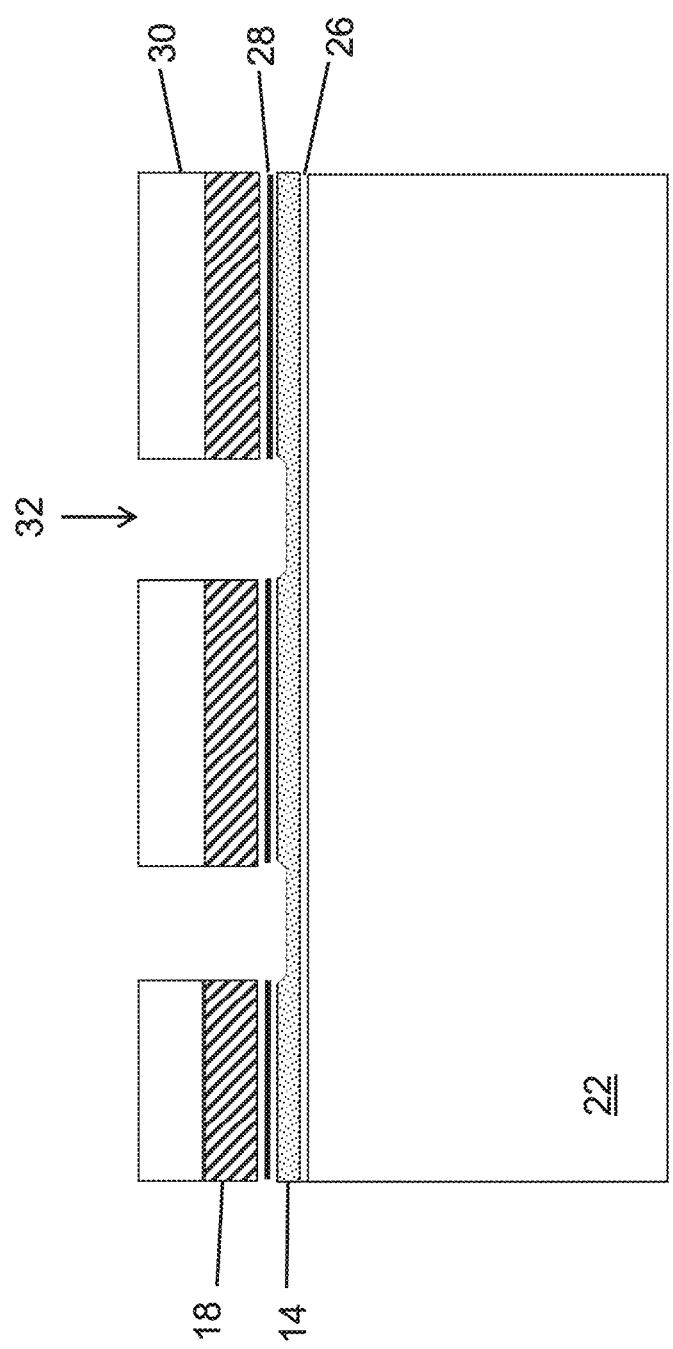
Figure 5C:
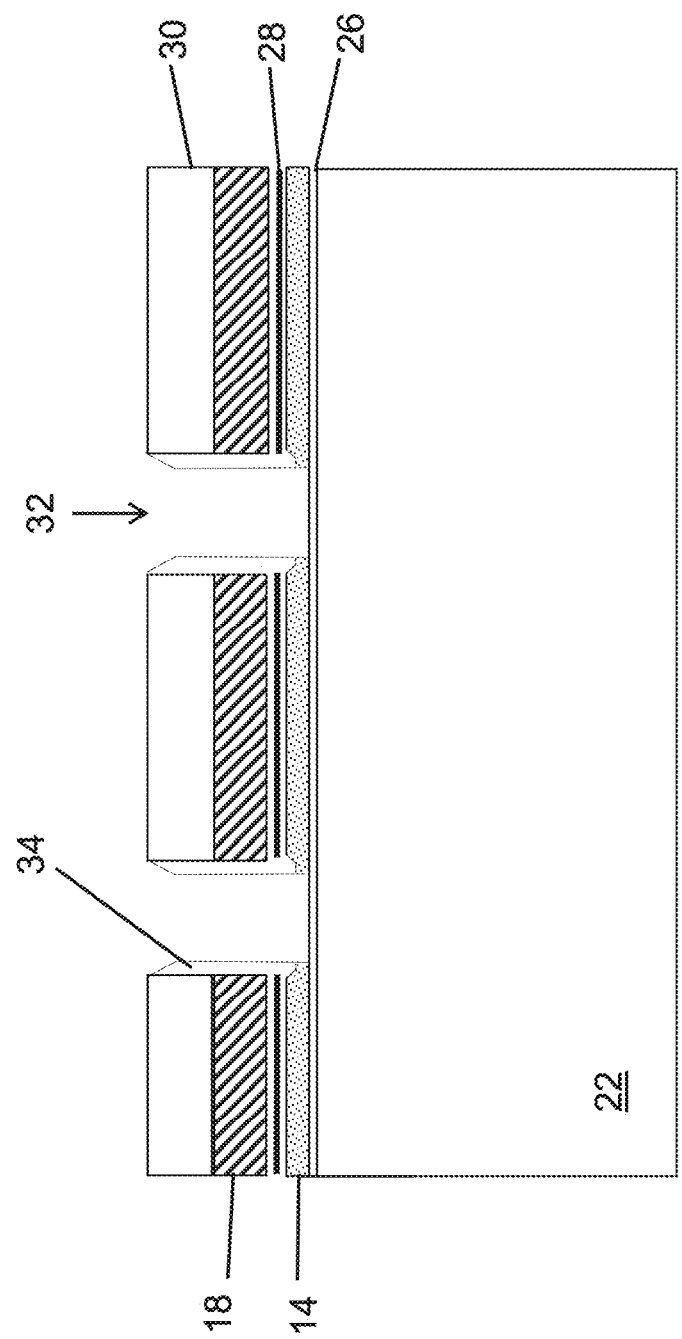

An ONO insulation layer 28 (oxide-nitride-oxide) is formed on the FG poly layer 14, followed by poly deposition and etch back to form a poly layer 18 (CG poly layer) that will form the coupling gates 18A/18B. A hard mask 30 is formed over the CG poly layer 18, and is patterned using photolithography to selectively expose the CG poly layer 18. Poly/ONO etches are then used to form trenches 32 that extend through the CG poly layer 18 and the ONO layer 28. The resulting structure is shown in FIG. 5B (a cross section view in the bit line direction—orthogonal to the view of FIG. 5A).

A coupling gate sidewall HTO deposition and anneal is performed, followed by a nitride deposition and etch that leaves nitride spacers 34 along the sidewalls of the trenches 32. After pre-cleaning and a sacrificial oxide deposition and spacer etch, a poly etch is performed to extend the trenches through the FG poly layer 14. The resulting structure is shown FIG. 5C.

Figure 5D:
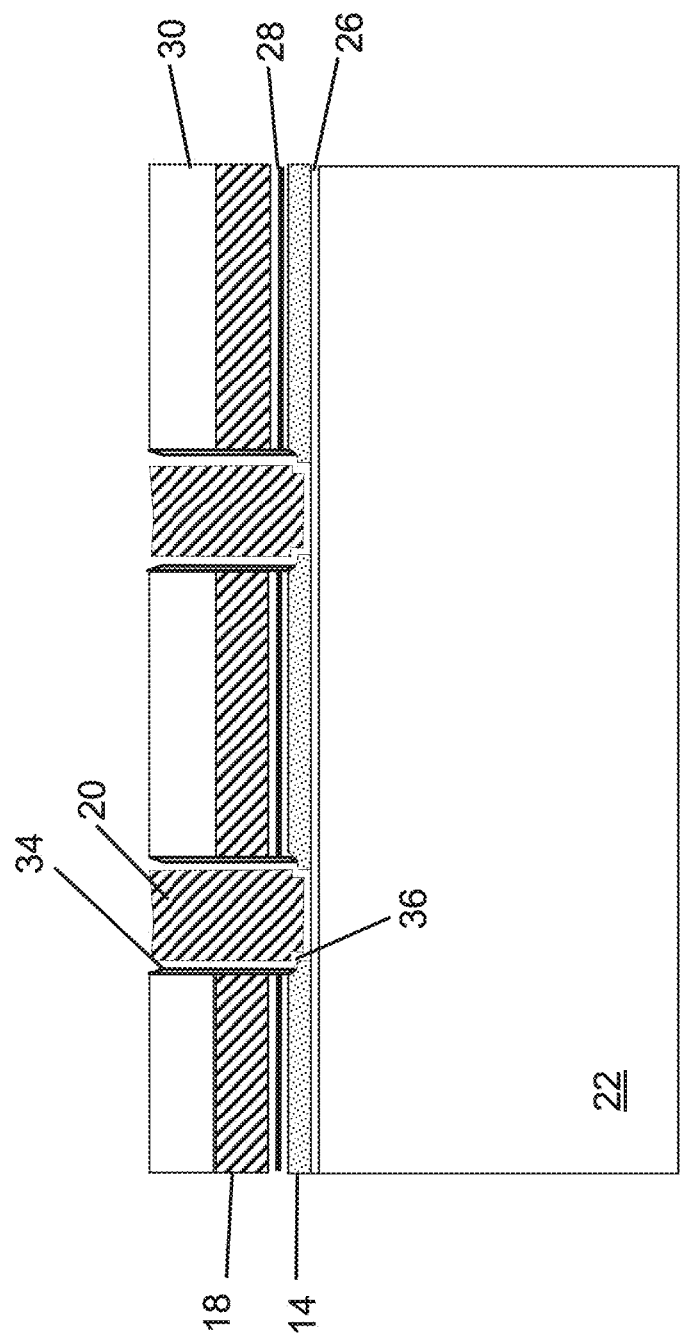

After removal of the sacrificial oxide, a tunnel oxide layer 36 at the bottom of the trenches 32 along the exposed ends of the FG poly layer 14 is formed by oxide deposition/formation followed by anneal. The trenches 32 are then filled with blocks of polysilicon (EG poly blocks 20) by polysilicon deposition followed by CMP etch back. Preferably, if logic devices are concurrently being formed on the same wafer, this poly deposition and etch back are used to form the gates of such logic devices. The resulting structure is shown in FIG. 5D.

Figure 5E:
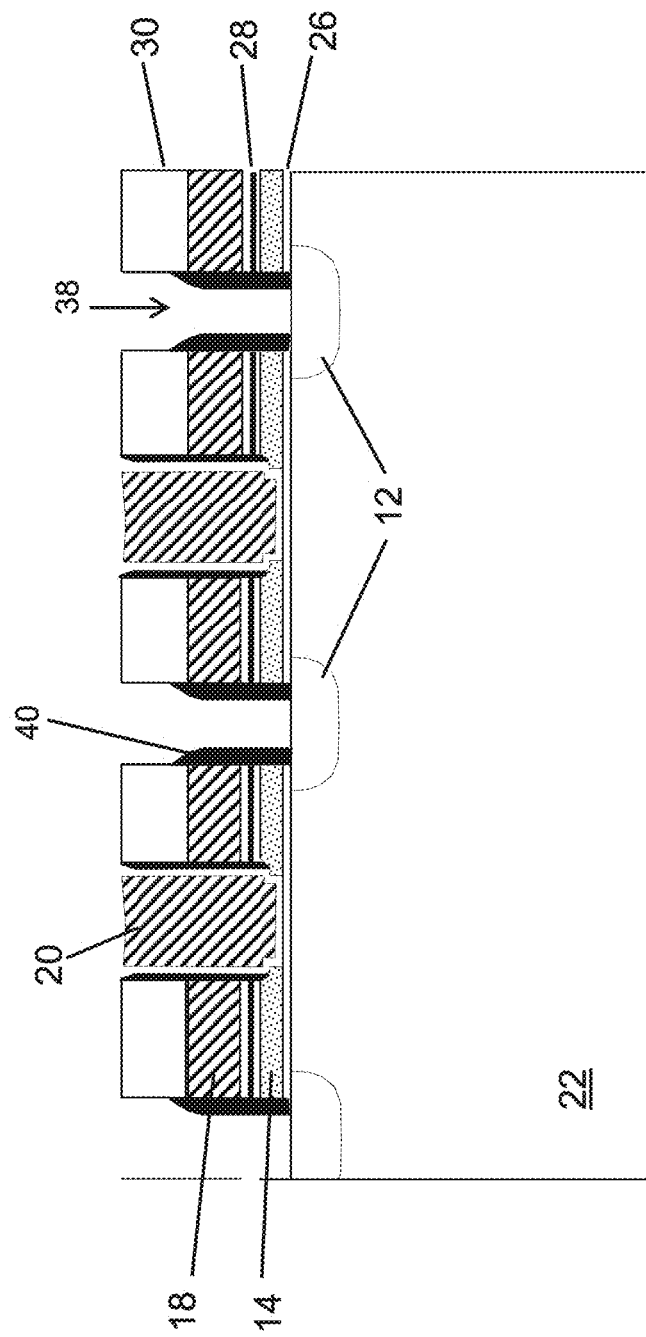

The hard mask 30 is patterned again by photolithography to leave portions of the CG poly 18 exposed. The exposed portions of the CG poly layer 18, ONO 28, and FG poly 14 are etched to form second trenches 38 that alternate with the first trenches 32 (i.e. the first and second trenches alternate each other such that each second trench 38 is disposed between a pair of adjacent first trenches 32, and vice versa). An LDD implant is performed to form the drain (bit line) regions 12 in the substrate 22 under the second trenches 38. Oxide layer 26 at the bottom of trenches 38 can be removed before or after the LDD implant. Nitride deposition and etch back are used to form nitride spacers 40 along the sidewalls of second trenches 38. The resulting structure (containing all the above described components of the memory cell pair of the present invention) is shown in FIG. 5E.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
   forming a plurality of separated first trenches into a surface of a semiconductor substrate, wherein the first trenches are parallel to each other and extend in a first direction and define active regions of the substrate between the first trenches;
   filling the first trenches with insulation material;
   forming a first insulation layer on the surface of the substrate in each of the active regions;

forming a first conductive layer on the first insulation layer in each of the active regions;
forming a second insulation layer on the first conductive layer in each of the active regions;
forming a second conductive layer on the second insulation layer in each of the active regions;
forming a third insulation layer on the second conductive layer in each of the active regions;
forming a plurality of separated second trenches through the third insulation layer, wherein the second trenches are parallel to each other and extend in a second direction perpendicular to the first direction;
extending the second trenches through the second conductive layer and the second insulation layer;
extending the second trenches through the first conductive layer, leaving side portions of the first conductive layer exposed and leaving the first insulation layer on the surface of the substrate at the bottom of the second trenches;
forming a fourth insulation layer vertically and directly on the first insulation layer at the bottom of the second trenches and along the exposed portions of the first conductive layer, wherein the fourth insulation layer is not in direct contact with the substrate;
filling the second trenches with conductive material, wherein the conductive material is insulated from the first conductive layer by the fourth insulation layer and from the substrate surface in a vertical direction by the first insulation layer and the fourth insulation layer;
forming a plurality of third trenches through the third insulation layer, wherein the third trenches are parallel to each other and extend in the second direction such that the second and third trenches alternate each other;
extending the third trenches through the second conductive layer, the second insulation layer, and the first conductive layer;
performing an implantation to form drain regions in the substrate under the third trenches.

2. The method of claim 1, further comprising:
forming spacers of insulation material along sidewalls of the second trenches after the extending of the second trenches through the second conductive layer and the second insulation layer, and before the extending of the second trenches through the first conductive layer.

3. The method of claim 1, further comprising:
forming spacers of insulation material along sidewalls of the third trenches after the extending of the third trenches through the second conductive layer, the second insulation layer, and the first conductive layer.

4. The method of claim 1, wherein the first and second conductive layers are polysilicon.

5. The method of claim 1, wherein the first insulation layer is oxide.

6. The method of claim 1, wherein the second insulation layer is an ONO insulation layer comprising oxide, nitride, and oxide sublayers.

7. A method of forming a memory device, comprising:
forming a plurality of separated first trenches into a surface of a semiconductor substrate, wherein the first trenches are parallel to each other and extend in a first direction and define active regions of the substrate between the first trenches;
filling the first trenches with insulation material;
forming a first insulation layer on the surface of the substrate in each of the active regions;
forming a first conductive layer on the first insulation layer in each of the active regions;
forming a second insulation layer on the first conductive layer in each of the active regions;
forming a second conductive layer on the second insulation layer in each of the active regions;
forming a third insulation layer on the second conductive layer in each of the active regions;
forming a plurality of separated second trenches through the third insulation layer, wherein the second trenches are parallel to each other and extend in a second direction perpendicular to the first direction;
extending the second trenches through the second conductive layer and the second insulation layer;
extending the second trenches through the first conductive layer, leaving side portions of the first conductive layer exposed and leaving the first insulation layer on the surface of the substrate at the bottom of the second trenches;
forming a fourth insulation layer vertically on the first insulation layer at the bottom of the second trenches and along the exposed portions of the first conductive layer, wherein the fourth insulation layer is not in direct contact with the substrate;
filling the second trenches with conductive material, wherein the conductive material is insulated from the first conductive layer by the fourth insulation layer and from the substrate surface in a vertical direction by the first insulation layer and the fourth insulation layer;
forming a plurality of third trenches through the third insulation layer, wherein the third trenches are parallel to each other and extend in the second direction such that the second and third trenches alternate each other;
extending the third trenches through the second conductive layer, the second insulation layer, and the first conductive layer;
performing an implantation to form drain regions in the substrate under the third trenches;
wherein the extending of the third trenches further includes extending the third trenches through the first insulation layer.

* * * * *